(12) United States Patent
Deshayes

(10) Patent No.: US 10,693,281 B2
(45) Date of Patent: Jun. 23, 2020

(54) DEVICE FOR ELECTRICALLY CONNECTING POWER DISTRIBUTION PLATES AND ELECTRICAL POWER DISTRIBUTION SYSTEM PROVIDED WITH SUCH A CONNECTION DEVICE

(71) Applicant: Zodiac Aero Electric, Montreuil (FR)

(72) Inventor: Olivier Deshayes, Rosny Sous Bois (FR)

(73) Assignee: Zodiac Aero Electric, Montreuil (FR)

( * ) Notice: Subject to any disclaimer, the term of this patent is extended or adjusted under 35 U.S.C. 154(b) by 0 days.

(21) Appl. No.: 15/638,079

(22) Filed: Jun. 29, 2017

(65) Prior Publication Data

US 2018/0062358 A1    Mar. 1, 2018

(30) Foreign Application Priority Data

Jul. 13, 2016    (FR) .................................... 16 56755

(51) Int. Cl.

| | |
|---|---|
| *H02B 1/20* | (2006.01) |
| *F16B 39/10* | (2006.01) |
| *H02B 1/48* | (2006.01) |
| *H01R 12/70* | (2011.01) |
| *H01R 12/73* | (2011.01) |
| *H02J 1/10* | (2006.01) |

(Continued)

(52) U.S. Cl.
CPC ........... *H02B 1/20* (2013.01); *H01R 12/7088* (2013.01); *H01R 12/732* (2013.01); *H02B 1/48* (2013.01); *H02J 1/10* (2013.01); *H02J 4/00* (2013.01); *H05K 7/1457* (2013.01); *B64D 41/00* (2013.01); *B64D 2221/00* (2013.01); *F16B 39/10* (2013.01); *H01R 25/164* (2013.01); *H01R 2201/26* (2013.01)

(58) Field of Classification Search
CPC .............. H01R 12/7088; H01R 12/732; H01R 2201/26; H01R 25/164; H02J 4/00; H02J 1/10; H02B 1/20; H02B 1/48; H05K 7/1457; B64D 41/00; B64D 2221/00; F16B 39/10
USPC ......................................................... 361/624
See application file for complete search history.

(56) References Cited

U.S. PATENT DOCUMENTS 3,104,276 A * 9/1963 Cataldo .................. H02G 5/007
                                                          174/88 B
3,180,924 A * 4/1965 Rowe ..................... H02G 5/007
                                                          174/88 B (Continued)

OTHER PUBLICATIONS

French Search Report and Written Opinion, dated Mar. 7, 2017 in corresponding French Patent Application No. 1656755, filed Jul. 3, 2016, 8 pages.

*Primary Examiner* — Anatoly Vortman
(74) *Attorney, Agent, or Firm* — Christensen O'Connor Johnson Kindness PLLC

(57) ABSTRACT

A device for electrically connecting power distribution plates, comprises a connector fastened to one end of a first plate and comprising power contacts for a second plate. The connector comprises a pair of separate electrical connection parts which together electrically connect two power busbars of the first plate to two power busbars of the second plate and each includes a base for electrically connecting and mechanically fastening the part to a power busbar of the first plate and a power contact branch extending from the base and intended to interact with a power busbar of the second plate.

9 Claims, 2 Drawing Sheets

(51) Int. Cl.
*H02J 4/00* (2006.01)
*H05K 7/14* (2006.01)
*B64D 41/00* (2006.01)
*H01R 25/16* (2006.01)

(56) References Cited

U.S. PATENT DOCUMENTS

| | | | | |
|---|---|---|---|---|
| 3,183,298 A | * | 5/1965 | Weimer | H01R 13/193 |
| | | | | 174/88 B |
| 3,365,537 A | * | 1/1968 | Fehr, Jr. | H02G 5/007 |
| | | | | 174/88 B |
| 3,555,293 A | * | 1/1971 | Shannon | H02G 5/007 |
| | | | | 174/68.3 |
| 3,647,937 A | * | 3/1972 | Jorgensen | H02G 5/007 |
| | | | | 174/68.3 |
| 4,009,920 A | * | 3/1977 | Hicks, Jr. | H02G 5/007 |
| | | | | 174/88 B |
| 4,705,334 A | * | 11/1987 | Slicer | H02G 5/007 |
| | | | | 174/68.2 |
| 4,842,533 A | * | 6/1989 | Beberman | H02G 5/007 |
| | | | | 174/88 B |
| 4,849,581 A | * | 7/1989 | Larkin | H02G 5/007 |
| | | | | 174/88 B |
| 4,886,940 A | * | 12/1989 | Gagnon | H01R 25/162 |
| | | | | 174/88 B |
| 5,011,421 A | * | 4/1991 | Duke | H02G 5/06 |
| | | | | 174/71 B |
| 5,760,339 A | * | 6/1998 | Faulkner | H01R 25/162 |
| | | | | 174/88 B |
| 6,435,888 B1 | * | 8/2002 | Reed, Jr. | H01R 4/30 |
| | | | | 174/88 B |
| 8,177,569 B1 | * | 5/2012 | Dozier | H02G 5/007 |
| | | | | 439/213 |
| 8,864,510 B2 | * | 10/2014 | Walgenbach | H02G 5/007 |
| | | | | 439/210 |
| 9,520,703 B2 | * | 12/2016 | Jaena | H02G 5/08 |
| 2004/0123458 A1 | | 7/2004 | Korsunsky et al. | |
| 2011/0136388 A1 | | 6/2011 | Fu et al. | |
| 2011/0151701 A1 | | 6/2011 | Ngo | |
| 2011/0300760 A1 | | 12/2011 | Ngo | |
| 2012/0190219 A1 | | 7/2012 | Pai et al. | |
| 2013/0135792 A1 | * | 5/2013 | Deshayes | H02B 1/20 |
| | | | | 361/637 |
| 2015/0244123 A1 | * | 8/2015 | Steinberger | H02B 1/21 |
| | | | | 439/119 |
| 2016/0156169 A1 | * | 6/2016 | Jaena | H02G 5/08 |
| | | | | 439/213 |

* cited by examiner

DEVICE FOR ELECTRICALLY CONNECTING POWER DISTRIBUTION PLATES AND ELECTRICAL POWER DISTRIBUTION SYSTEM PROVIDED WITH SUCH A CONNECTION DEVICE

TECHNICAL FIELD

The invention relates, in general, to electrical power distribution systems, especially for aircraft and, in particular, electrical power distribution systems provided with power distribution plates.

BACKGROUND

It is known that an electrical power distribution system within an aircraft has a pyramidal structure.

The electrical power is first of all generated using part of the power supplied by the engines of the aircraft to drive electrical power generators. The electrical power generated is delivered to distribution cabinets, also referred to as distribution "cores", in order to be subsequently redistributed either to loads or to secondary distribution boxes, at different amperages.

Power distribution plates are used to carry currents within the power distribution system, in particular within the distribution cabinets, due to the power levels carried within the cabinet, which may reach values in the megawatt range. They generally include an insulating plate to which an electrical distribution busbar is fastened.

The distribution busbars of the power plates are conventionally connected using an electrical connection device which includes a connector that is fastened to one end of a power busbar and in which another power busbar is connected.

FIGS. 1 and 2 illustrate such an electrical connection device according to the prior art, being used for the electrical connection of two plates 1 and 2 each comprising an insulating support 3, 4 to which respective power distribution busbars 5 and 6 are fastened.

The busbars 5 and 6 are connected by means of a connector 7 taking the overall form of a fork, fastened by a first end 8 to one of the busbars and comprising, at its opposite end, power contact branches, such as 9, being used for the electrical connection of the other busbar 5, interposed between power contacts 10.

With reference to FIG. 2, such a connection device is used to carry currents between two busbars 5 and 6 having one and the same potential VD (arrows F).

Such a connection device is an effective means for connecting distribution plates which convey only one voltage level.

However, when it comes to conveying multiple voltage levels, the plates and their connection devices must be duplicated.

This is especially the case when two power busbars are used to convey voltages having different polarities, for example positive and negative, which has drawbacks in terms of bulk, cost and complexity of assembly.

The object of the invention is to overcome these drawbacks.

SUMMARY

One subject of the invention, according to a first aspect, is a device for electrically connecting power distribution plates, comprising a connector fastened to one end of a first plate and comprising power contacts for a second plate.

The connector comprises a pair of separate electrical connection parts which together electrically connect two power busbars of the first plate to two power busbars of the second plate and each include, at one end, a base for electrically connecting and mechanically fastening the part to a power busbar of the first plate and a power contact branch extending from the base and intended to interact with a power busbar of the second plate.

Thus, by using a pair of electrical connection parts, it is possible to connect two power busbars having different respective potential levels simultaneously, thereby facilitating the connection of the power busbars, decreasing the number of connectors used to connect the busbars and allowing the general bulk of the power plates to be decreased.

The electrical connection device allows two dual-polarity power distribution plates to be electrically connected, or else two plates at a single potential to be electrically connected to a plate at two potentials.

According to another feature, the connection parts are made of metal, preferably of aluminium.

Advantageously, the power contacts comprise elastically deformable conductive strips fastened to the contact branches.

Stated otherwise, each contact branch comprises power contacts in the form of elastically deformable conductive strips.

Another subject of the invention, according to a second aspect, is an electrical power distribution system comprising power distribution plates and devices for electrically connecting plates each comprising a connector fastened to one end of a first plate and comprising power contacts for a second plate.

The connector comprises a pair of separate electrical connection parts which together electrically connect two power busbars of the first plate to two power busbars of the second plate and each include a base for electrically connecting and mechanically fastening the part to a power busbar of the first plate and a power contact branch extending from the base and intended to interact with a power busbar of the second plate.

In one embodiment, the distribution plates each comprise an insulating plate and two power busbars having different polarities provided on two mutually opposite faces of the plate.

Thus, the connection parts are advantageously fastened on either side of the first plate.

The power busbars may be bonded or screwed to the insulating plate.

Regarding the connection parts, they may be fastened to the first plate by means of screwing or crimping or fastened by force thereto by means of pads.

The electrical connection device allows two dual-polarity power distribution plates to be electrically connected, or else two plates at a single potential to be electrically connected to a plate at two potentials.

DESCRIPTION OF THE DRAWINGS

Other objects, features and advantages of the invention will become apparent on reading the following description, which is given solely by way of non-limiting example and with reference to the appended drawings, in which.

DETAILED DESCRIPTION

Figure 1:
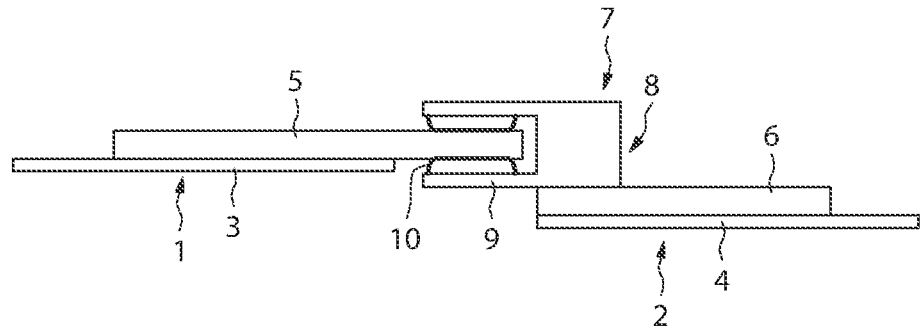
FIGS. 1 and 2, of which mention has already been made, illustrate the arrangement of a device for electrically connecting power distribution plates according to the prior art.
Figure 2:
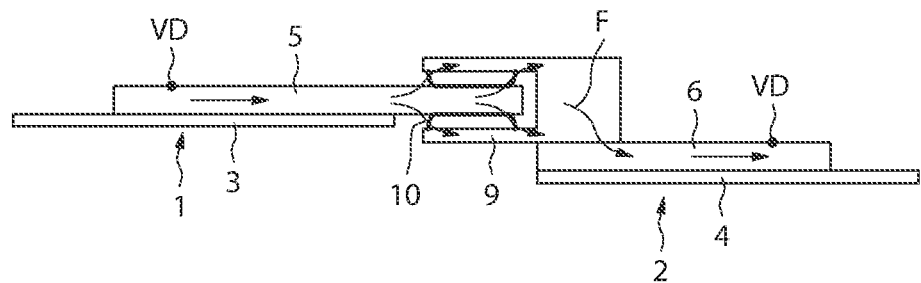
Figure 3:
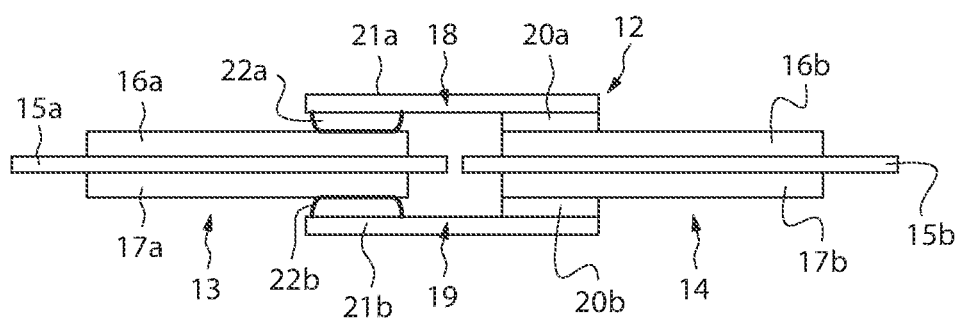
FIGS. 3 and 4 illustrate the structure of an electrical connection device according to one embodiment of the invention.
Figure 4:
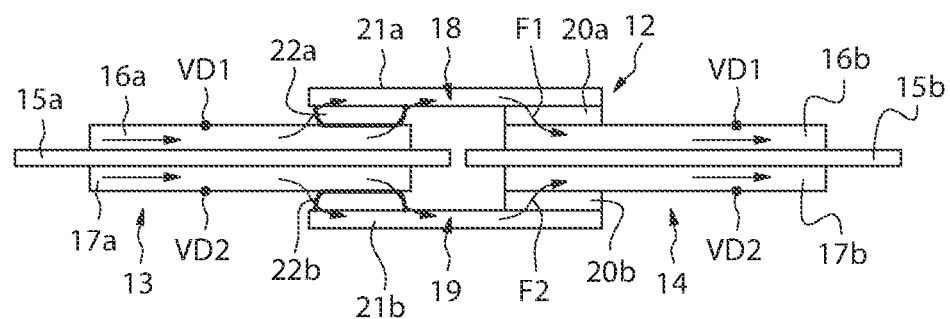

FIGS. 3 and 4 illustrate one exemplary embodiment of a device for electrically connecting power distribution plates according to one embodiment of the invention.

The electrical connection device, denoted by the general numerical reference 12, is intended to provide the electrical connection of two dual-polarity power distribution plates 13 and 14.

Specifically, as may be seen, each power distribution plate 13 and 14 includes an insulating plate, such as 15 (individually, 15a or 15b), for example made of polychlorobiphenyl (PCB) and two power busbars 16 (individually, 16a or 16b) and 17 (individually, 17a or 17b) fastened to, for example by bonding or screwing, or else mounted by force on, two mutually opposite faces of the corresponding insulating plate 15.

These two busbars are intended to be set to two different potential levels VD1 and VD2. They are, for example, made of aluminium or of copper.

Regarding the electrical connection device, the latter comprises a connector consisting of a pair of connection parts 18 and 19 each comprising, at one end, a base, such as 20a, 20b, for electrically connecting and mechanically fastening the power busbars of one of the plates 14 to a contact branch 21 (individually, 21a or 21b) extending from the base 20 in the direction of the other plate.

Stated otherwise, the two connection parts 18 and 19 each provide the electrical connection of a busbar of one of the plates to a busbar of the other plate. The busbars are thus fastened, by one of their ends, on either side of the first distribution plate 14 and are electrically connected, by their other end, to the other plate 13.

The connection parts may be made of metal, for example of aluminium or of copper.

As may be seen, electrical contacts produced in the form of elastically deformable metal strips, such as 22 (individually, 22a or 22b), or in the form of electrical joints or plungers interposed between the branches 21 and the power busbars 16 and 17 are advantageously used. The strips are shaped so as to provide close contact with the power busbars that is sufficient to withstand the vibratory environment to which the connection devices are subjected, while allowing ease of connection.

These electrical contacts are for example fastened to the branches 21, for example by welding or by screwed clip-fastening.

The connection parts 18 and 19 may be fastened to the plate 14 by any suitable means.

In one embodiment, this fastening is achieved by brazing, screwing or crimping or using a pin riveted to the connection parts and to the distribution plates.

They may also be force-fitted to the first plate by providing pads on the connection parts.

Advantageously, two fastening points are used, for example two pins that are riveted in order to prevent any rotation of the connection device with respect to the distribution plate to which it is fastened.

Of course, the connection parts may be formed as a single part with the power busbars without departing from the scope of the invention.

As will be appreciated, the invention that has just been described allows the simultaneous electrical connection of two power busbars using a single electrical connection device, thereby optimizing the volume used and decreasing manufacturing costs.

An electrical connection device according to the invention does indeed allow currents to be carried between the distribution plate busbars at two different potentials $V_{D1}$ and $V_{D2}$ (arrows F1 and F2).

It has also been shown that the electrical connection device according to the invention allows improved insertion of the power plates insofar as only one connector is necessary to connect the power busbars.

Lastly, the superposition of the two polarities in a non-inductive network makes it possible to limit line inductances.

Lastly, the invention that has just been disclosed is not limited to the embodiment described.

Specifically, in the embodiment described with reference to FIGS. 3 and 4, the two connection parts are fastened to the first plate which includes two power busbars 16 and 17 fastened to two mutually opposite faces of an insulating plate 15.

Figure 5:
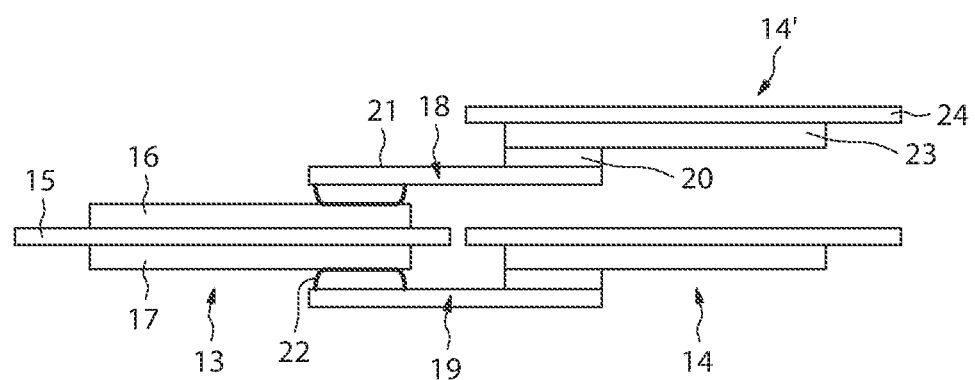
FIG. 5 illustrates another mode of implementation of an electrical connection device according to the invention.

In the embodiment of FIG. 5, in which elements identical to those described above bear the same numerical references, the connection device, which includes two connection parts 18 and 19 each having a base 20 and a contact branch 21 provided with its metal strip 22, provides the electrical connection of two plates 14 and 14' at a single potential to a plate 13 at two potentials.

The plate 13 at two potentials, which comprises the insulating plate and the two power busbars 16 and 17, is connected to the two contact branches 21, as described above with reference to FIGS. 3 and 4.

The plates at a single potential each have a single power busbar, such as 23, fastened to a single insulating plate, such as 24.

The base 20 is thus provided on the side of the connection part facing the power busbar to which it is fastened.

The embodiments of the invention in which an exclusive property or privilege is claimed are defined as follows:

1. A device electrically connecting dual-polarity power distribution plates (13, 14), comprising a connector (12) fastened to one end of a first dual-polarity power distribution plate (14) and comprising power contacts for a second dual-polarity power distribution plate (13), wherein:

the connector (12) comprises a pair of separate electrical connection parts (18, 19) which together electrically connect two power busbars (16b, 17b) of the first dual-polarity power distribution plate (14) to two power busbars (16a, 17a) of the second dual-polarity power distribution plate (13), the device further comprising:

a first electrical connection part (18) comprising three different parts, wherein said first electrical connection part (18) comprises:

a first power contact branch (21a);

a first base (20a) fixed at a first end of the first power contact branch (21a); and a first deformable metal strip (22a) fixed at a second end of the first power contact branch (21a), opposite to the first end of the first power contact branch (21a), wherein the first base (20a) electrically connects and mechanically non-reversibly rigidly fastens said first electrical connection part (18) to a first power busbar (16b) of the first dual-polarity power distribution plate (14), wherein the first power contact branch (21a) extends from the first base (20a) towards the second dual-polarity power distribution plate (13); and wherein the first deformable metal strip (22a) electrically connects said first power busbar (16b) of the first dual-polarity power distribution plate (14) to a first power busbar (16a) of the second dual-polarity power distribution plate (13); the first electrical connection part (18) being elastically deformable only at its first deformable metal strip (22a); and a second electrical connection part (19) comprising three different parts, wherein said second electrical connection part (19) comprises:
a second power contact branch (21b);
a second base (20b) fixed at a first end of the second power contact branch (21b); and
a second deformable metal strip (22b) fixed at a second end of the second power contact branch (21b), opposite to the first end of said second power contact branch (21b), wherein the second base (20b) electrically connects and mechanically non-reversibly rigidly fastens said second electrical connection part (19) to a second power busbar (17b) of the first dual-polarity power distribution plate (14), wherein the second power contact branch (21b) extends from the second base (20b) towards the second dual-polarity power distribution plate (13), and wherein the second deformable metal strip (22b) electrically connects the second power busbar (17b) of the first power distribution plate (14) to the second power busbar (17a) of the second power distribution plate (13), the second electrical connection part (19) being elastically deformable only at its second deformable metal strip (22b), wherein the first and second power busbars (16b, 17b) of the first dual-polarity power distribution plate (14) are connected to two different potential levels and are located between the first and second electrical connection parts (18, 19), wherein the first and second power busbars (16a, 17a) of the second dual-polarity power distribution plate (13) are connected to two different potential levels and are located between the first and second electrical connection parts (18, 19).

2. The device according to claim 1, in which the first and second electrical connection parts (18, 19) are made of metal.

3. The device according to claim 1, in which the first deformable metal strip (22a) and the second deformable metal strip (22b) are elastically deformable conductive strips.

4. The device according to claim 3, in which the first and second deformable metal strips (22a, 22b) are fastened to their respective power contact branches (21a, 21b).

5. The device according to claim 1, wherein the first and second dual-polarity power distribution plates (14, 13), each comprise a respective insulating plate (15b, 15a) and wherein two pairs of the power busbars (16b and 17b, 16a and 17a) are provided on two mutually opposite faces of said respective insulating plates (15b, 15a).

6. The device according to claim 5, in which the first power bar (16b) of the first dual-polarity power distribution plate (14) and the first power bar (16a) of the second dual-polarity power distribution plate (13) have one polarity, and the second power bar (17b) of the first dual-polarity power distribution plate (14) and the second power bar (17a) of the second dual-polarity power distribution plate (13) has another polarity.

7. The device according to claim 5, in which the first and second electrical connection parts (18, 19) are fastened on either side of the first power distribution plate (14).

8. The device according to claim 5, in which each pair of the first and second power busbars (16a and 17a, 16b and 17b) are bonded or screwed to a respective insulating plate (15a, 15b).

9. The device according to claim 5, in which the first and second electrical connection parts (18, 19) are fastened to the first dual-polarity power distribution plate (14) by means of screwing or crimping.

\* \* \* \* \*